(12) United States Patent
Wu et al.

(10) Patent No.: US 9,955,610 B2
(45) Date of Patent: Apr. 24, 2018

(54) HEAT DISSIPATION ASSEMBLY

(71) Applicant: DELTA ELECTRONICS, INC., Taoyuan (TW)

(72) Inventors: Chih-Chi Wu, Taoyuan (TW); I-Shen Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/250,222

(22) Filed: Aug. 29, 2016

(65) Prior Publication Data
US 2018/0027699 A1    Jan. 25, 2018

(30) Foreign Application Priority Data
Jul. 22, 2016   (CN) ............... 2016 2 0776101 U

(51) Int. Cl.
*H05K 7/20*       (2006.01)
*H01L 23/40*     (2006.01)
*H01L 23/367*   (2006.01)

(52) U.S. Cl.
CPC ..... *H05K 7/20436* (2013.01); *H01L 23/3675* (2013.01); *H01L 23/4093* (2013.01)

(58) Field of Classification Search
CPC ............ H05K 7/20436; H05K 7/2049; H05K 2201/10598
USPC ................................. 361/709–710
See application file for complete search history.

(56) References Cited

U.S. PATENT DOCUMENTS 5,077,638 A * 12/1991 Andersson .......... H01L 23/4093
                                                                 165/185
5,991,151 A * 11/1999 Capriz ................ H01L 23/4093
                                                                 165/185
2008/0019095 A1    1/2008  Liu

FOREIGN PATENT DOCUMENTS

DE       29808296 U1    10/1998
DE       20120695 U1     4/2003
GB        2184887 A       7/1987

* cited by examiner

*Primary Examiner* — Mukund G Patel
(74) *Attorney, Agent, or Firm* — Kirton McConkie; Evan R. Witt

(57) ABSTRACT

A heat dissipation assembly includes a heat sink, an electronic component and an elastic fastener. The heat sink includes a contact surface, an engaging part and a wing part. The engaging part and the wing part are protruded externally from the contact surface. An accommodation space is defined by the engaging part, the wing part and the contact surface. The engaging part has a concave structure disposed within the accommodation space. The electronic component is disposed on the contact surface. The elastic fastener includes a first free end, a bent segment and a second free end. The first free end is locked on an inner wall of the concave structure. The bent segment is contacted with a first sidewall of the wing part. The second free end is locked on an external surface of the electronic component. Consequently, the electronic component is attached and fixed on the contact surface.

11 Claims, 7 Drawing Sheets

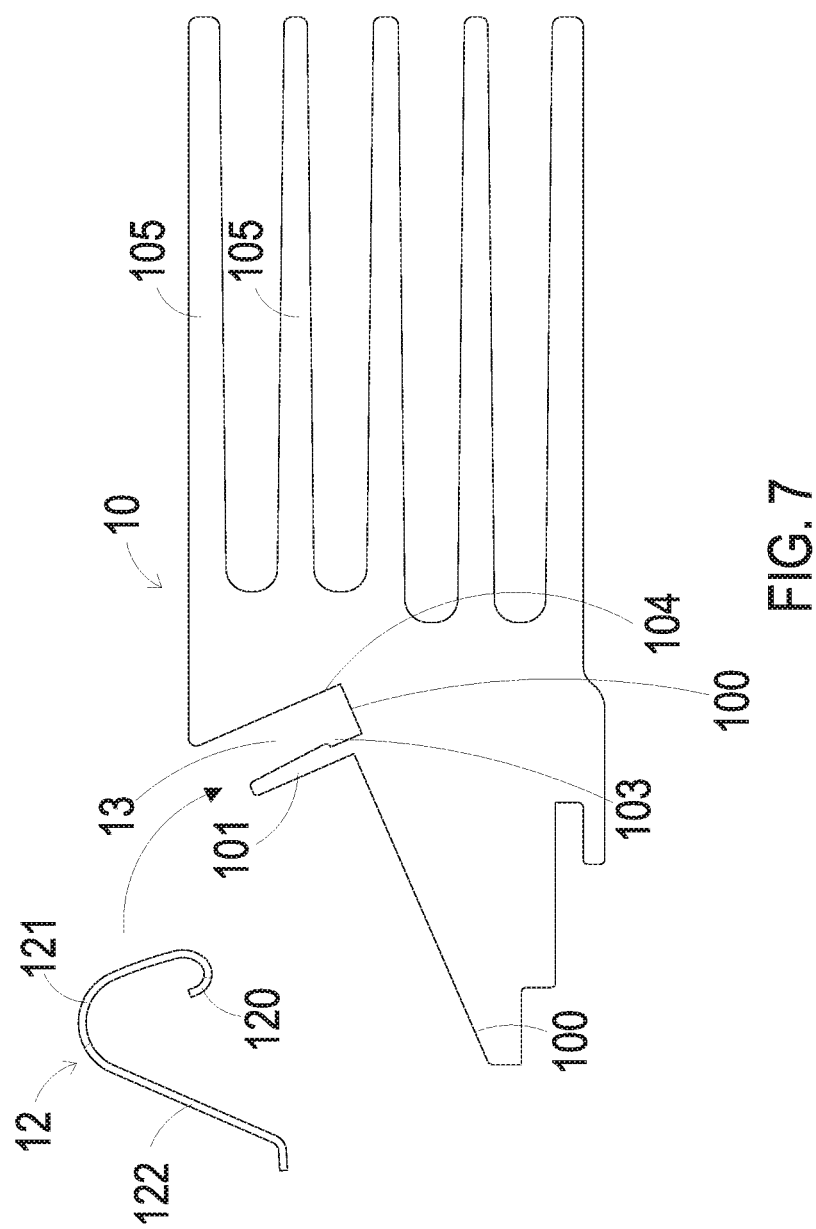

HEAT DISSIPATION ASSEMBLY

TECHNICAL FIELD

The present disclosure relates to a heat dissipation assembly, and more particularly to a heat dissipation assembly using an elastic fastener to fix an electronic component on a heat sink.

BACKGROUND OF THE DISCLOSURE

With instant development of electronic and information industries, the processing capability of some electronic components such as central processing units, switch elements or rectifiers is gradually increased. During operation of the electronic component, a great amount of heat is generated. For transferring the heat from the electronic component to the surroundings, a heat sink with the functions of collecting, transferring and dissipating heat is widely used. Moreover, for quickly dissipating the heat of the electronic component, the electronic component has to be fixed on the heat sink and maintained in close contact with the heat sink. Conventionally, a fixed-type fastener is used to facilitate fixing the electronic component on the heat sink.

Nowadays, some kinds of fixed-type fasteners matching the heat sinks have been introduced into the market. Generally, it is necessary to provide bolts, screws or comparable fastening elements to couple the fixed-type fastener with the heat sink. That is, the assembling process is complicated. Moreover, it is difficult to control the fastening force of fixing the electronic component on the heat sink through the fixed-type fastener. If the fastening force is too small, the electronic component is not securely fixed on the heat sink. If the fastening force is too large, the fixed-type fastener or the heat sink is possibly suffered from deformation and the electronic component is possibly damaged.

Therefore, there is a need of providing a heat dissipation assembly in order to overcome the above drawbacks.

SUMMARY OF THE DISCLOSURE

An object of the present disclosure provides a heat dissipation assembly that is assembled in a simplified manner. It is not necessary to use bolts, screws or comparable fastening elements to fix electronic component on the heat sink. Moreover, the fastening force is proper.

In accordance with an aspect of the present disclosure, there is provided a heat dissipation assembly. The heat dissipation assembly includes a heat sink, an electronic component and an elastic fastener. The heat sink includes a contact surface, an engaging part and a wing part. The engaging part and the wing part are protruded externally from the contact surface of the heat sink. An accommodation space is defined by the engaging part, the wing part and the contact surface collaboratively. The engaging part has a concave structure. The concave structure is disposed within the accommodation space. The electronic component is disposed on the contact surface. The elastic fastener includes a first free end, a bent segment and a second free end. The first free end is accommodated within the accommodation space and locked on at least one inner wall of the concave structure. The bent segment is accommodated within the accommodation space and contacted with a first sidewall of the wing part. The second free end is locked on an external surface of the electronic component. Consequently, the electronic component is attached and fixed on the contact surface of the heat sink.

In accordance with another aspect of the present disclosure, there is provided a heat dissipation assembly. The heat dissipation assembly includes a heat sink, an electronic component and an elastic fastener. The heat sink includes a contact surface, an engaging part and a wing part. The engaging part and the wing part are protruded externally from the contact surface of the heat sink. An accommodation space is defined by the engaging part, the wing part and the contact surface collaboratively. The engaging part has a concave structure. The concave structure is disposed within the accommodation space. The electronic component is attached on the contact surface. The engaging part is arranged between the wing part and the electronic component. The elastic fastener includes a first free end, a bent segment and a second free end. The first free end is accommodated within the accommodation space and locked on at least one inner wall of the concave structure. The bent segment is accommodated within the accommodation space and contacted with a first sidewall of the wing part. The second free end is locked on an external surface of the electronic component. Consequently, the electronic component is attached and fixed on the contact surface of the heat sink.

The above contents of the present disclosure will become more readily apparent to those ordinarily skilled in the art after reviewing the following detailed description and accompanying drawings, in which:

BRIEF DESCRIPTION OF THE DRAWINGS

FIG. 7 is a schematic exploded view illustrating the relationship between a heat sink and an elastic fastener of the heat dissipation assembly of FIG. 6.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. In the following embodiments and drawings, the elements irrelevant to the concepts of the present disclosure are omitted and not shown.

Figure 1:
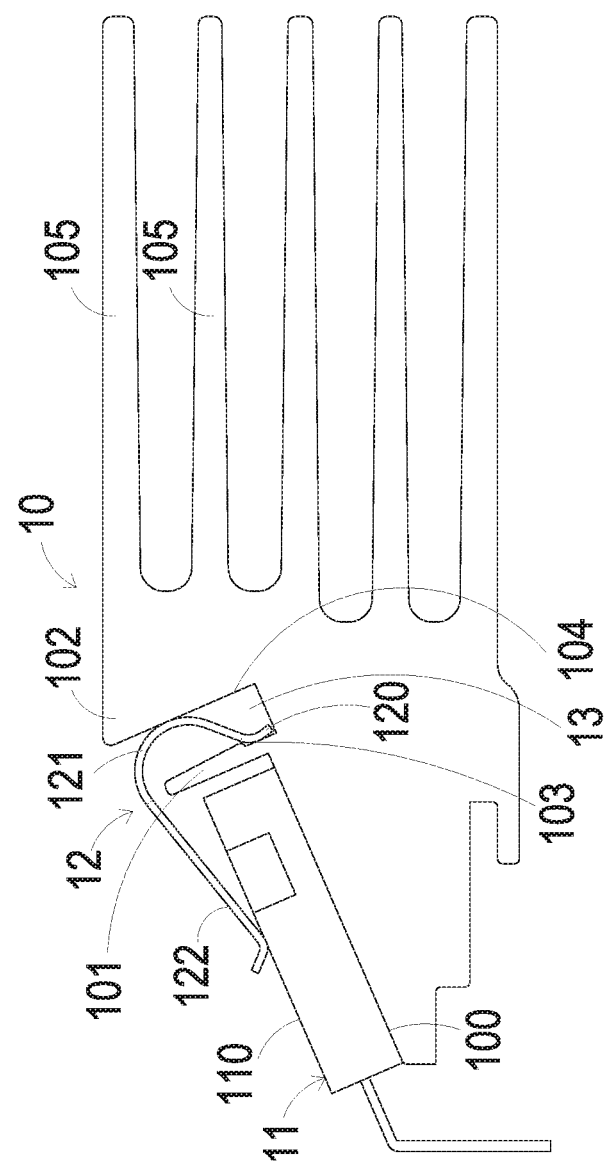
FIG. 1 is a schematic assembled view illustrating a heat dissipation assembly according to a first embodiment of the present disclosure.
Figure 2:
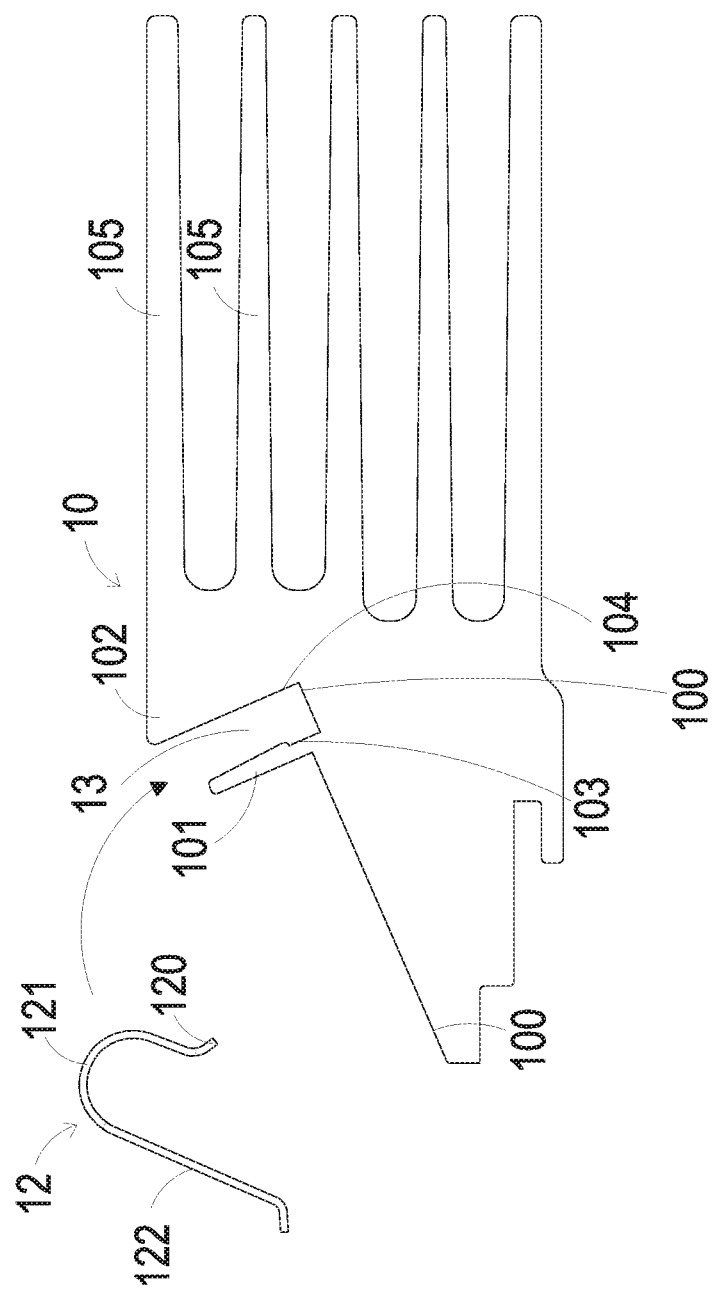
FIG. 2 is a schematic exploded view illustrating the relationship between a heat sink and an elastic fastener of the heat dissipation assembly of FIG. 1.
Figure 3:
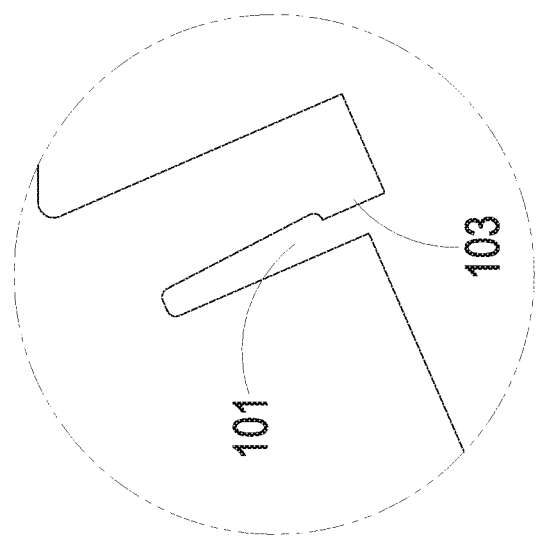
FIG. 3 is an enlarged fragmentary view illustrating the heat sink of the heat dissipation assembly of FIG. 1.

FIG. 1 is a schematic assembled view illustrating a heat dissipation assembly according to a first embodiment of the present disclosure. FIG. 2 is a schematic exploded view illustrating the relationship between a heat sink and an elastic fastener of the heat dissipation assembly of FIG. 1. FIG. 3 is an enlarged fragmentary view illustrating the heat sink of the heat dissipation assembly of FIG. 1. As shown in FIGS. 1, 2 and 3, the heat dissipation assembly 1 comprises a heat sink 10, an electronic component 11 and an elastic fastener 12. Preferably but not exclusively, the heat sink 10 is made of a metallic material. The heat sink 10 comprises a contact surface 100, an engaging part 101 and a wing part 102. The engaging part 101 and the wing part 102 are protruded externally from the contact surface 100 of the heat sink 10. Moreover, an accommodation space 13 is defined by the engaging part 101, the wing part 102 and the contact surface 100 collaboratively. The engaging part 101 has a concave structure 103. The concave structure 103 is disposed within the accommodation space 13. Preferably but not exclusively, the concave structure 103 is located near the contact surface 100. More specifically, in this embodiment, the concave structure 103 is located adjacent to the contact surface 100.

An example of the electronic component 11 includes but is not limited to a central processing unit, a switch element (e.g., IGBT), or a rectifier. Moreover, the electronic component 11 is disposed on the contact surface 100 of the heat sink 10. During operation of the electronic component 11, the heat generated by the electronic component 11 is dissipated away through the heat sink 10.

The elastic fastener 12 comprises a first free end 120, a bent segment 121 and a second free end 122. The first free end 120 is accommodated within the accommodation space 13 and locked on at least one inner wall of the concave structure 103. The bent segment 121 is partially accommodated within the accommodation space 13 and contacted with a first sidewall 104 of the wing part 102. The second free end 122 is locked on an external surface 110 of the electronic component 11. Consequently, the electronic component 11 is attached and fixed on the contact surface 100 of the heat sink 10.

A process of assembling the heat sink 10, the electronic component 11 and the elastic fastener 12 as the heat dissipation assembly 1 will be described as follows. Firstly, the electronic component 11 is placed on the contact surface 100 of the heat sink 10. Then, an external force is applied to the elastic fastener 12. In response to the external force, the first free end 120 and the bent segment 121 of the elastic fastener 12 are accommodated within the accommodation space 13, and the second free end 122 of the elastic fastener 12 is contacted with the external surface 110 of the electronic component 11. Then, in response to the external force, the first free end 120 is locked on at least one inner wall of the concave structure 103. After the external force is released, the second free end 122 is locked on the external surface 110 of the electronic component 11 in response to the elastic force of the elastic fastener 12. Consequently, the electronic component 11 is attached and fixed on the contact surface 100 of the heat sink 10. Moreover, in response to the elastic force of the elastic fastener 12, the first free end 120 is locked on at least one inner wall of the concave structure 103. Consequently, the elastic fastener 12 will not detached from the accommodation space 13.

As mentioned above, the elastic fastener 12 can provide the elastic force. In response to the elastic force of the elastic fastener 12, the electronic component 11 is fixed on the heat sink 10. Moreover, in response to the elastic force of the elastic fastener 12, the first free end 120 is locked on at least one inner wall of the concave structure 103 and the elastic fastener 12 is fixed on the heat sink 10. Since it is not necessary to additionally uses bolts or screws to fix the electronic component 11 on the heat sink 10, the assembling process is simplified. Moreover, since the electronic component 11 is fixed on the heat sink 10 in response to the elastic force, the elastic fastening force is not too large or too small. Under this circumstance, the electronic component 11 is in close contact with the heat sink 10, and the possibility of causing damage of the electronic component 11 is largely reduced. Moreover, since the first free end 120 of the elastic fastener 12 is engaged with the concave structure 103, the elastic fastener 12 is fixed on the heat sink 10. Moreover, the contact area between the first free end 120 and the concave structure 103 is large enough, and the joint between the first free end 120 and the concave structure 103 is not a curvy surface. Consequently, the tangential force at the joint between the first free end 120 and the concave structure 103 is small. That is, if no external force is applied to the elastic fastener 12, the first free end 120 is not easily detached from the concave structure 103. Consequently, the elastic fastener 12 can stably fixed on the heat sink 10.

In an embodiment, the engaging part 101 is closer to the electronic component 11 than the wing part 102. That is, the engaging part 101 is arranged between the wing part 102 and the electronic component 11. The length of the concave structure 103 is larger than or equal to the length of the first free end 120 of the elastic fastener 12. Consequently, the first free end 120 of the elastic fastener 12 can be accommodated within the concave structure 103. As shown in FIGS. 1 and 2, the first sidewall 104 of the wing part 102 has a flat surface. Moreover, a first end of the bent segment 121 is connected with the first free end 120, and a second end of the bent segment 121 is connected with the second free end 122. Preferably, the first free end 120, the bent segment 121 and the second free end 122 are integrally formed with each other. In this embodiment, the first free end 120 of the elastic fastener 12 is extended in a direction away from the bent segment 121. Moreover, the wing part 102 comprises plural fins 105. The plural fins 105 are protruded from a second sidewall of the wing part 102, wherein the second sidewall is opposed to the first sidewall 104.

Hereinafter, some embodiments of the heat dissipation assembly will be described as follows. Component parts and elements corresponding to those of the first embodiment are designated by identical numeral references, and detailed descriptions thereof are omitted.

Figure 4:
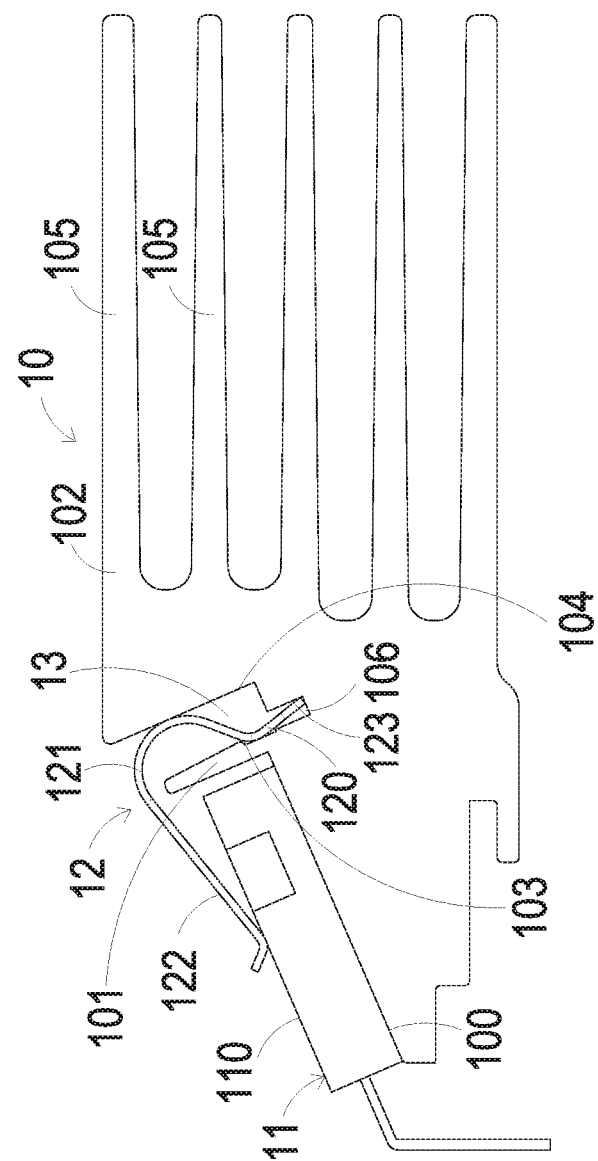
FIG. 4 is a schematic assembled view illustrating a heat dissipation assembly according to a second embodiment of the present disclosure.
Figure 5:
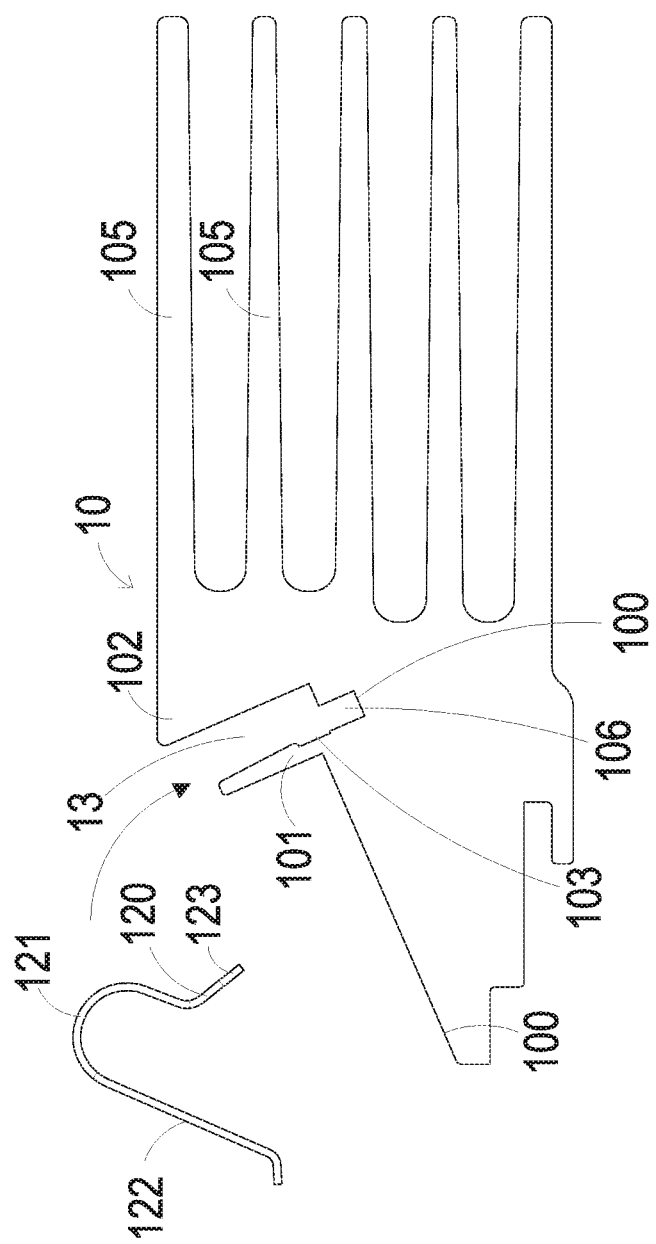
FIG. 5 is a schematic exploded view illustrating the relationship between a heat sink and an elastic fastener of the heat dissipation assembly of FIG. 4.

FIG. 4 is a schematic assembled view illustrating a heat dissipation assembly according to a second embodiment of the present disclosure. FIG. 5 is a schematic exploded view illustrating the relationship between a heat sink and an elastic fastener of the heat dissipation assembly of FIG. 4. In this embodiment, the heat sink 10 further comprises an indentation structure 106. The indentation structure 106 is in communication with the accommodation space 13 and concavely formed on the contact surface 100 of the heat sink 10. Moreover, the elastic fastener 12 further comprises an extension part 123 corresponding to the indentation structure 106. The extension part 123 is extended from the first free end 120. When the first free end 120 is contacted with the at least one inner wall of the concave structure 103, the extension part 123 is protruded out of the concave structure 103 and inserted into the indentation structure 106. Due to the engagement between the indentation structure 106 and the extension part 123, the elastic fastener 12 is fixed on the heat sink 10 more securely.

As mentioned above, the engagement between the indentation structure 106 and the extension part 123 can facilitate fixing the elastic fastener 12 on the heat sink 10. Consequently, in some other embodiments, the engaging part 101 is not equipped with the concave structure 103. That is, the heat sink 10 is equipped with the indentation structure 106, and the elastic fastener 12 is equipped with the extension part 123.

Figure 6:
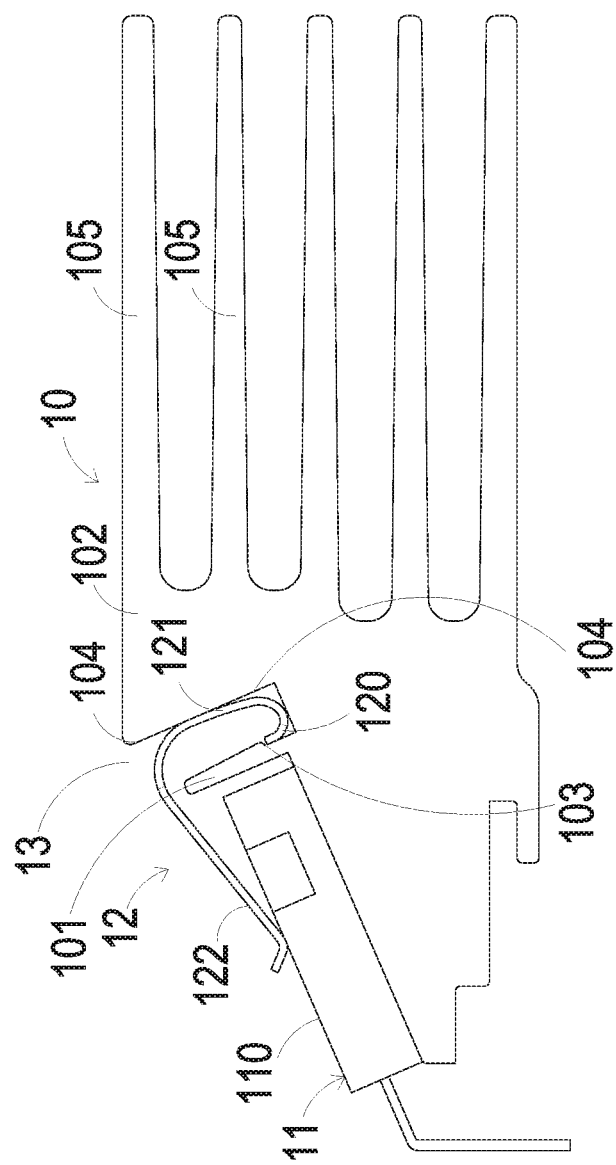
FIG. 6 is a schematic assembled view illustrating a heat dissipation assembly according to a third embodiment of the present disclosure.

FIG. 6 is a schematic assembled view illustrating a heat dissipation assembly according to a third embodiment of the present disclosure. FIG. 7 is a schematic exploded view illustrating the relationship between a heat sink and an elastic fastener of the heat dissipation assembly of FIG. 6. In the above two embodiments, the first free end 120 of the elastic fastener 12 is extended in a direction away from the bent segment 121. Whereas, in this embodiment, the first free end 120 of the elastic fastener 12 is extended in a direction toward the bent segment 121.

From the above descriptions, the present disclosure provides a heat dissipation assembly. In response to the elastic force of the elastic fastener, the electronic component is fixed on the heat sink. Due to the engagement between the first free end of the elastic fastener and the concave structure, the elastic fastener is fixed on the heat sink. That is, the assembling process is simplified. Moreover, the elastic fastening force is not too large or too small. Consequently, the electronic component is securely fixed on the heat sink, and the possibility of causing damage of the electronic component is largely reduced. Moreover, since the first free end of the elastic fastener is engaged with the concave structure, the elastic fastener is fixed on the heat sink. Moreover, the contact area between the first free end and the concave structure is large enough, and the joint between the first free end and the concave structure is not a curvy surface. Consequently, the tangential force at the joint between the first free end and the concave structure is small, and the elastic fastener can stably fixed on the heat sink.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipation assembly, comprising:
   a heat sink comprising a contact surface, an engaging part and a wing part, wherein the engaging part and the wing part are protruded externally from the contact surface of the heat sink, and an accommodation space is defined by the engaging part, the wing part and the contact surface collaboratively, wherein the engaging part has a concave structure, and the concave structure is disposed within the accommodation space;
   an electronic component disposed on the contact surface; and
   an elastic fastener comprising a first free end, a bent segment and a second free end, wherein the first free end is accommodated within the accommodation space and locked on at least one inner wall of the concave structure, the bent segment is accommodated within the accommodation space and contacted with a first sidewall of the wing part, and the second free end is locked on an external surface of the electronic component, so that the electronic component is attached and fixed on the contact surface of the heat sink;
   wherein the heat sink further comprises an indentation structure, wherein the indentation structure is in communication with the accommodation space and concavely formed on the contact surface of the heat sink;
   wherein the elastic fastener further comprises an extension part, and the extension part is extended from the first free end, wherein when the first free end is contacted with the at least one inner wall of the concave structure, the extension part is protruded out of the concave structure and inserted into the indentation structure.

2. The heat dissipation assembly according to claim 1, wherein the engaging part is closer to the electronic component than the wing part.

3. The heat dissipation assembly according to claim 1, wherein a length of the concave structure is larger than or equal to a length of the first free end.

4. The heat dissipation assembly according to claim 1, wherein a sidewall of the wing part has a flat surface.

5. The heat dissipation assembly according to claim 1, wherein a first end of the bent segment is connected with the first free end, and a second end of the bent segment is connected with the second free end, wherein the first free end, the bent segment and the second free end are integrally formed with each other.

6. The heat dissipation assembly according to claim 5, wherein the first free end of the elastic fastener is extended in a direction away from the bent segment.

7. The heat dissipation assembly according to claim 5, wherein the first free end of the elastic fastener is extended in a direction toward the bent segment.

8. The heat dissipation assembly according to claim 1, wherein the wing part comprises plural fins, and the plural fins are protruded from a second sidewall of the wing part, wherein the second sidewall is opposed to the first sidewall.

9. The heat dissipation assembly according to claim 1, wherein the concave structure is located near the contact surface of the heat sink.

10. A heat dissipation assembly, comprising:
    a heat sink comprising a contact surface, an engaging part and a wing part, wherein the engaging part and the wing part are protruded externally from the contact surface of the heat sink, and an accommodation space is defined by the engaging part, the wing part and the contact surface collaboratively, wherein the engaging part has a concave structure, and the concave structure is disposed within the accommodation space;
    an electronic component attached on the contact surface, wherein the engaging part is arranged between the wing part and the electronic component; and
    an elastic fastener comprising a first free end, a bent segment and a second free end, wherein the first free end is accommodated within the accommodation space and locked on at least one inner wall of the concave structure, the bent segment is accommodated within the accommodation space and contacted with a first sidewall of the wing part, and the second free end is locked on an external surface of the electronic component, so that the electronic component is attached and fixed on the contact surface of the heat sink;
    wherein the heat sink further comprises an indentation structure, wherein the indentation structure is in communication with the accommodation space and concavely formed on the contact surface of the heat sink;
    wherein the elastic fastener further comprises an extension part, and the extension part is extended from the first free end, wherein when the first free end is contacted with the at least one inner wall of the concave structure, the extension part is protruded out of the concave structure and inserted into the indentation structure.

11. The heat dissipation assembly according to claim 10, wherein a sidewall of the wing part has a flat surface.

* * * * *